(12) United States Patent
Tan et al.

(10) Patent No.: US 8,691,638 B2
(45) Date of Patent: Apr. 8, 2014

(54) HIGH-K METAL GATE DEVICE

(75) Inventors: Shyue Seng Tan, Singapore (SG);
Chunshan Yin, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 133 days.

(21) Appl. No.: 12/964,748

(22) Filed: Dec. 10, 2010

(65) Prior Publication Data

US 2012/0146160 A1 Jun. 14, 2012

(51) Int. Cl.
*H01L 21/00* (2006.01)
*H01L 21/84* (2006.01)

(52) U.S. Cl.
USPC 438/151; 257/262; 257/E29.16; 257/E21.625

(58) Field of Classification Search
USPC ............ 438/149, 151; 257/262, 288, E29.16, 257/E21.625
See application file for complete search history.

(56) References Cited

U.S. PATENT DOCUMENTS

| | | | |
|---|---|---|---|
| 6,982,230 B2 * | 1/2006 | Cabral et al. .................. | 438/778 |
| 7,445,976 B2 * | 11/2008 | Schaeffer et al. ............. | 438/197 |
| 2002/0173104 A1 * | 11/2002 | Chang ............................ | 438/279 |
| 2006/0231925 A1 * | 10/2006 | Paranjpe et al. .............. | 257/565 |
| 2007/0152276 A1 * | 7/2007 | Arnold et al. ................. | 257/369 |
| 2008/0064191 A1 * | 3/2008 | Teo et al. ....................... | 438/530 |
| 2008/0128676 A1 | 6/2008 | Lee et al. | |
| 2009/0166770 A1 | 7/2009 | Gluschenkov et al. | |
| 2009/0302396 A1 * | 12/2009 | Chen et al. .................... | 257/369 |
| 2010/0109095 A1 * | 5/2010 | Li et al. ......................... | 257/392 |

FOREIGN PATENT DOCUMENTS

| | | |
|---|---|---|
| DE | 10 2009 032 037 B4 | 8/2012 |
| DE | 11 2010 001 364 T5 | 10/2012 |

OTHER PUBLICATIONS

V.Narayanan et al., Band-Edge High-Performance High-k/Metal Gate n-MOSFETs using Cap Layers Containing Group IIA and IIIB Elements with Gate-First Processing for 45 nm and Beyond, Symposium on VLSI Technology Digest of Technical Papers, 2006, 2 pp., USA.
Tsu-Jae King et al., A Polycrystalline-Si1-xGex—GATE CMOS Technology, IEDM, 1990, pp. 253-256, USA.
Marie-Ange Eyoum and Tsu-Jae King, Low-Resistance Silicon—Germanium Contact Technology for Modular Integration of MEMS with Electronics, Journal of the Electrochemical Society, 151 (3) pp. J21-J25 (2004).
Akiyoshi Muto et al., Ni-Salicided Poly-Si/poly-SiGe-Layered Gate Technology for 65-nm-node CMOSFETs, Japanese Journal of Applied Physics, vol. 43, No. 4B, 2004, pp. 1773-1777.
Marie-Ange Eyoum and Tsu-Jae King, Contact Resistivity of p+ SiGe Deposited onto TiN*, (DARPA) MEMS N66001-00-1-8955, 2003.
Tsu-Jae King et al., Interconnect Issues for Integrated MEMS Technology, Oct. 2002.

* cited by examiner

*Primary Examiner* — Sonya D McCall Shepard
(74) *Attorney, Agent, or Firm* — Horizon IP Pte Ltd

(57) ABSTRACT

A method of forming a semiconductor device is presented. The method includes providing a substrate. The method further includes forming a gate stack having a gate electrode on the substrate, which includes forming a metal gate electrode layer. A buffer gate electrode layer is formed on top of the metal gate electrode layer and a top gate electrode layer having a poly-silicon alloy is formed over the metal gate electrode layer.

16 Claims, 13 Drawing Sheets

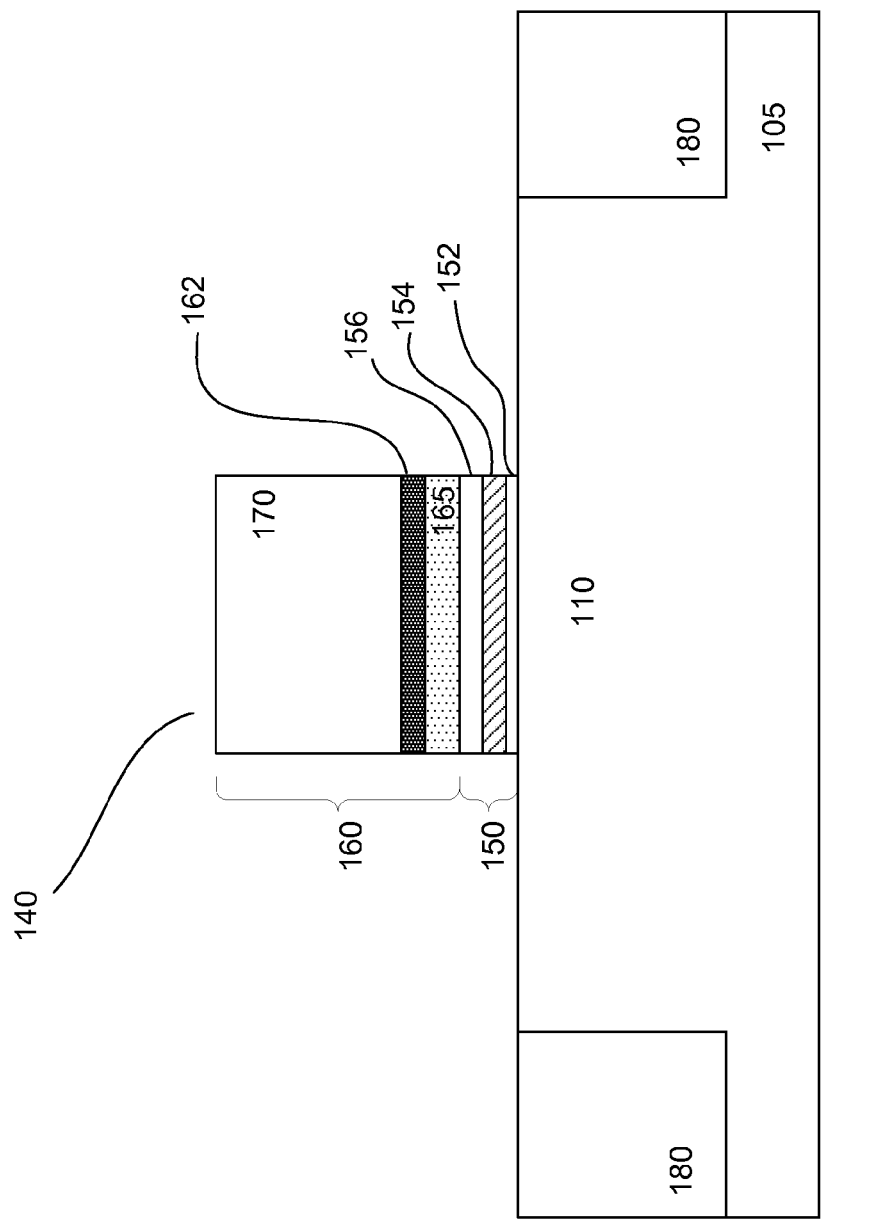

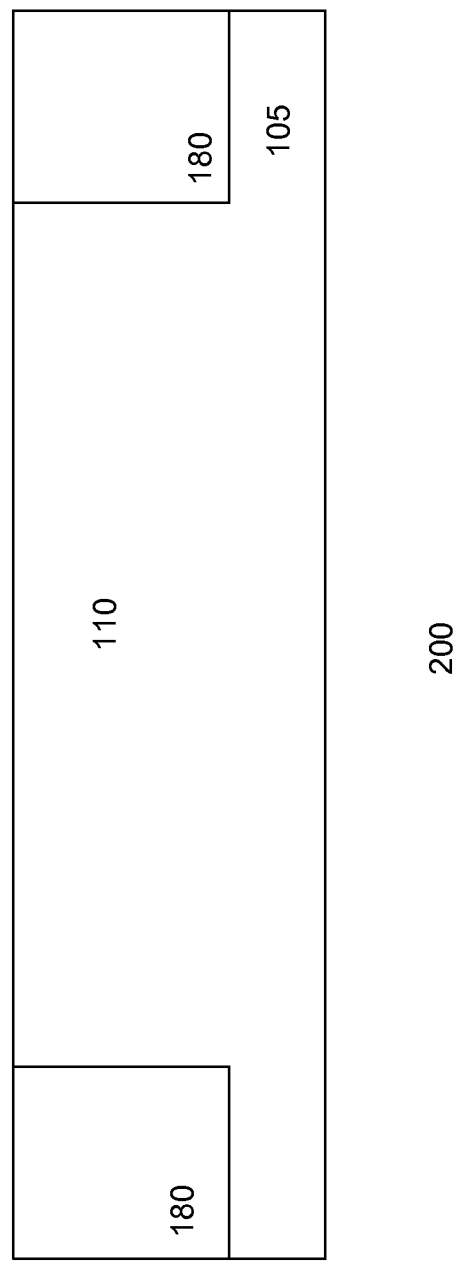

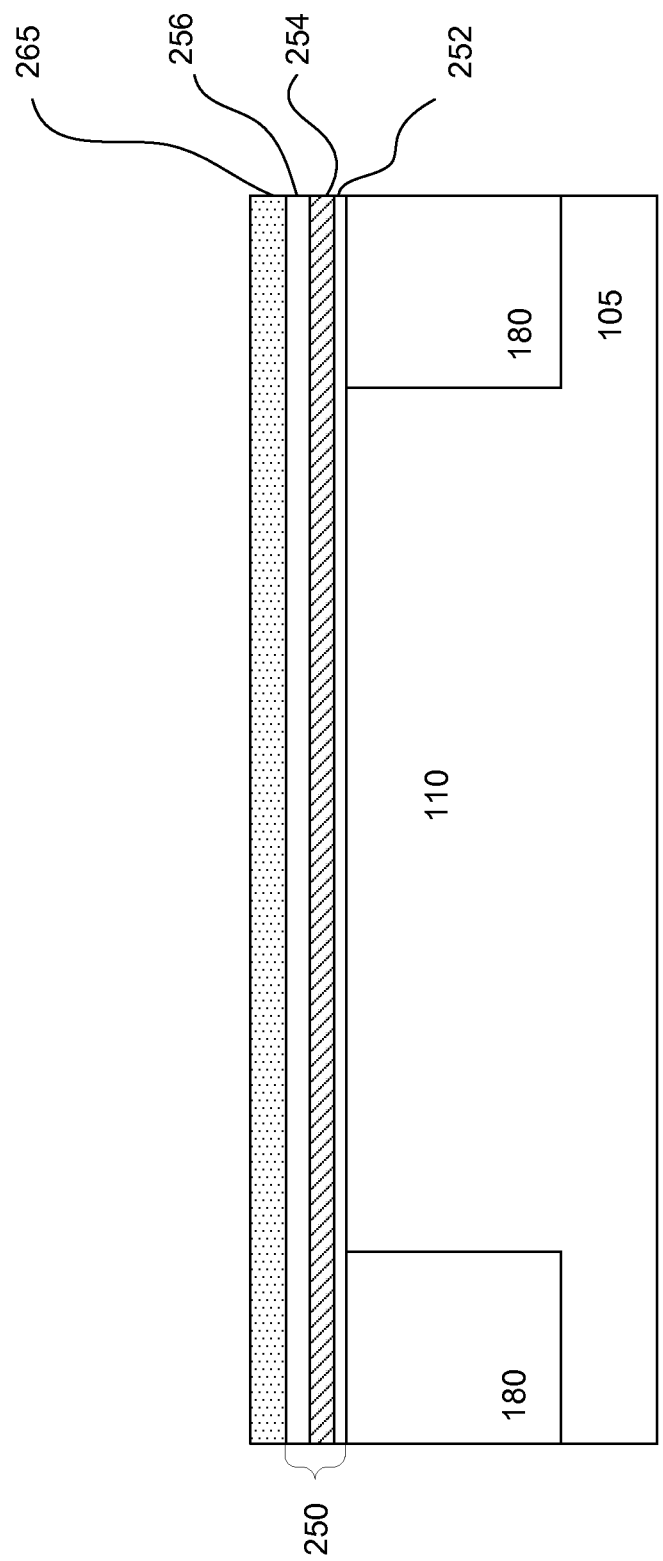

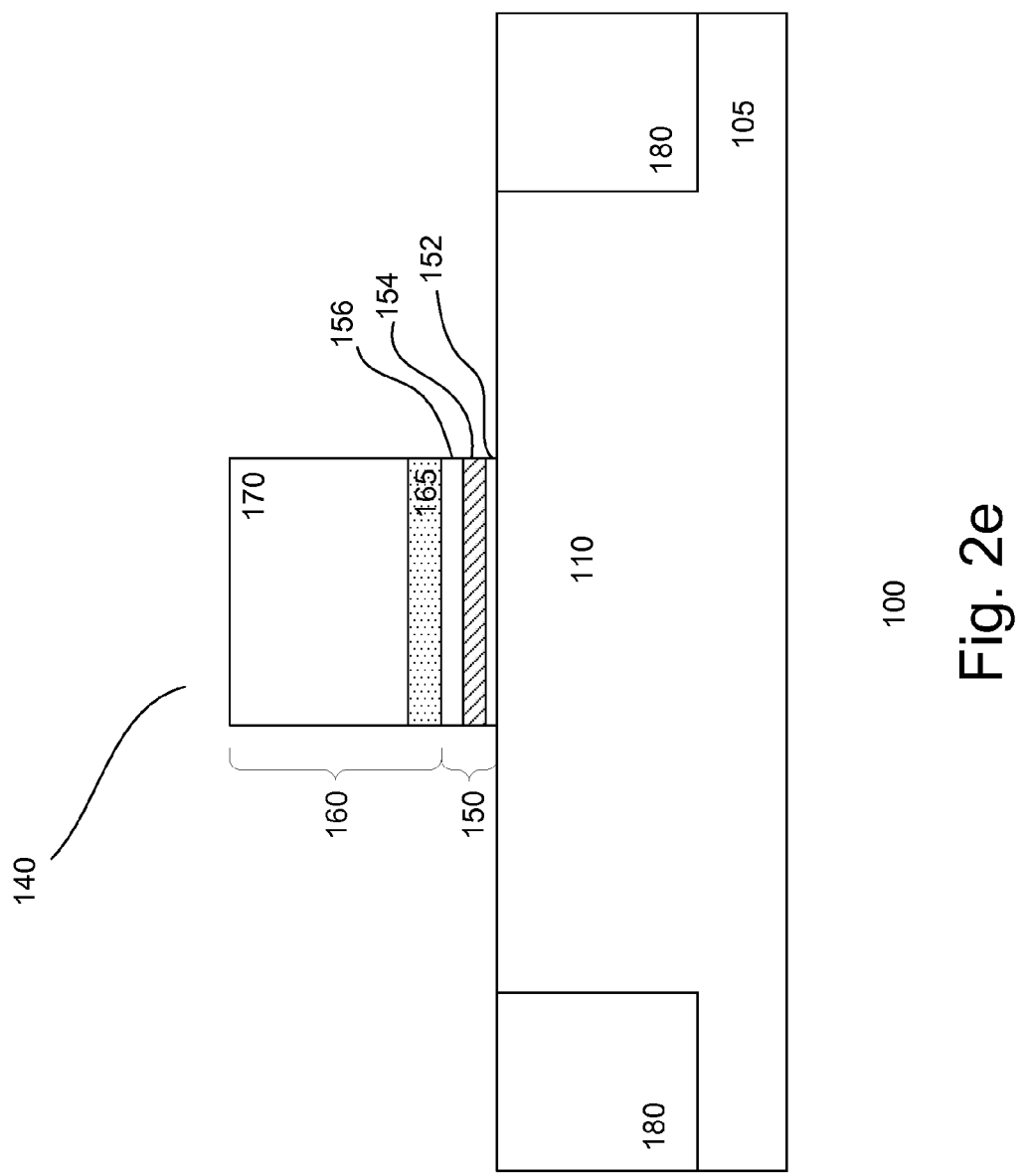

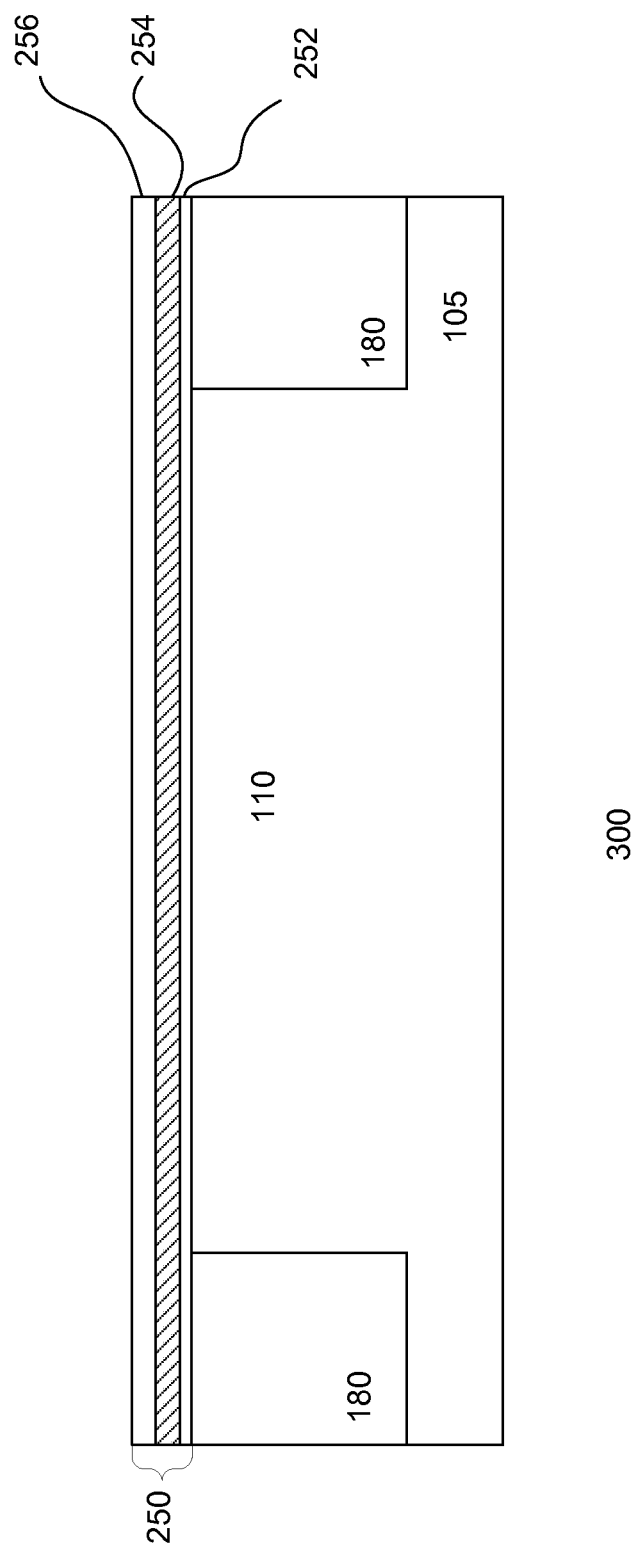

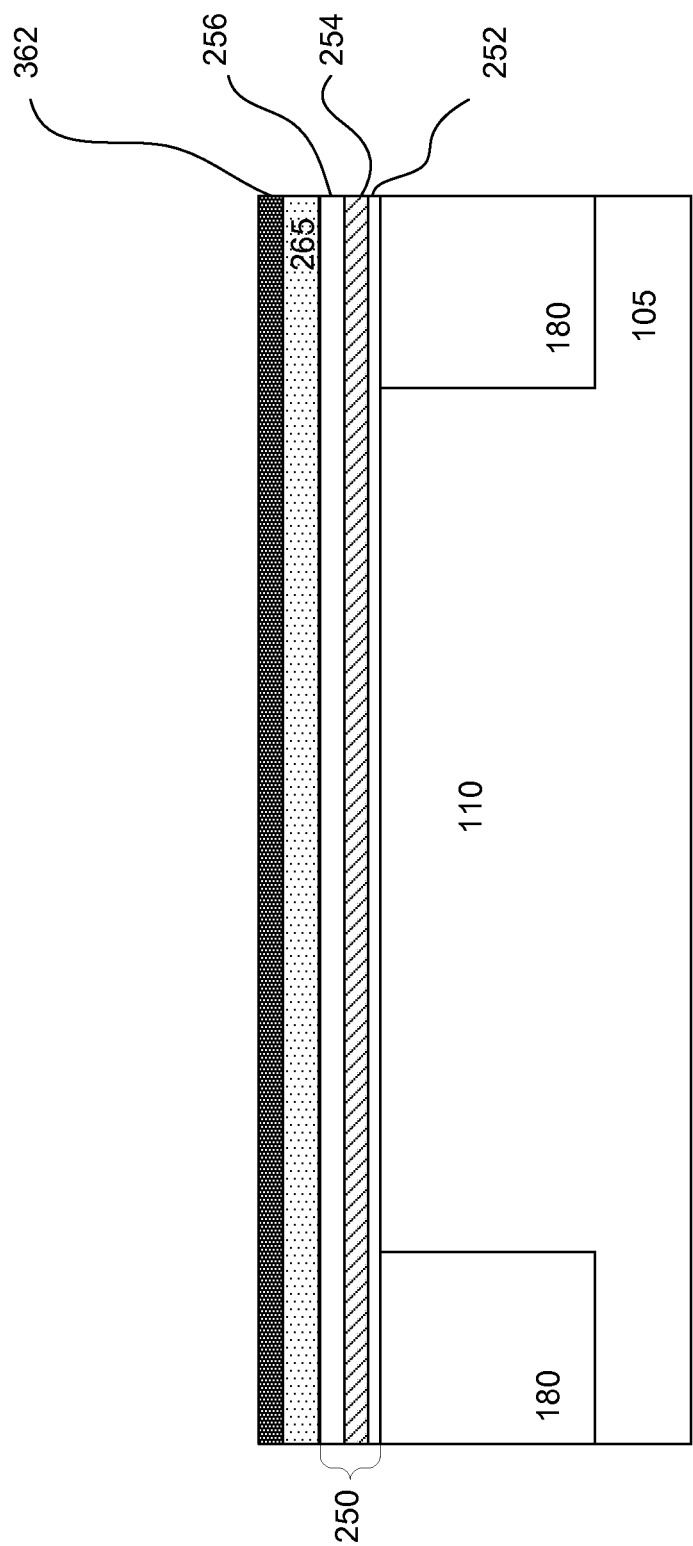

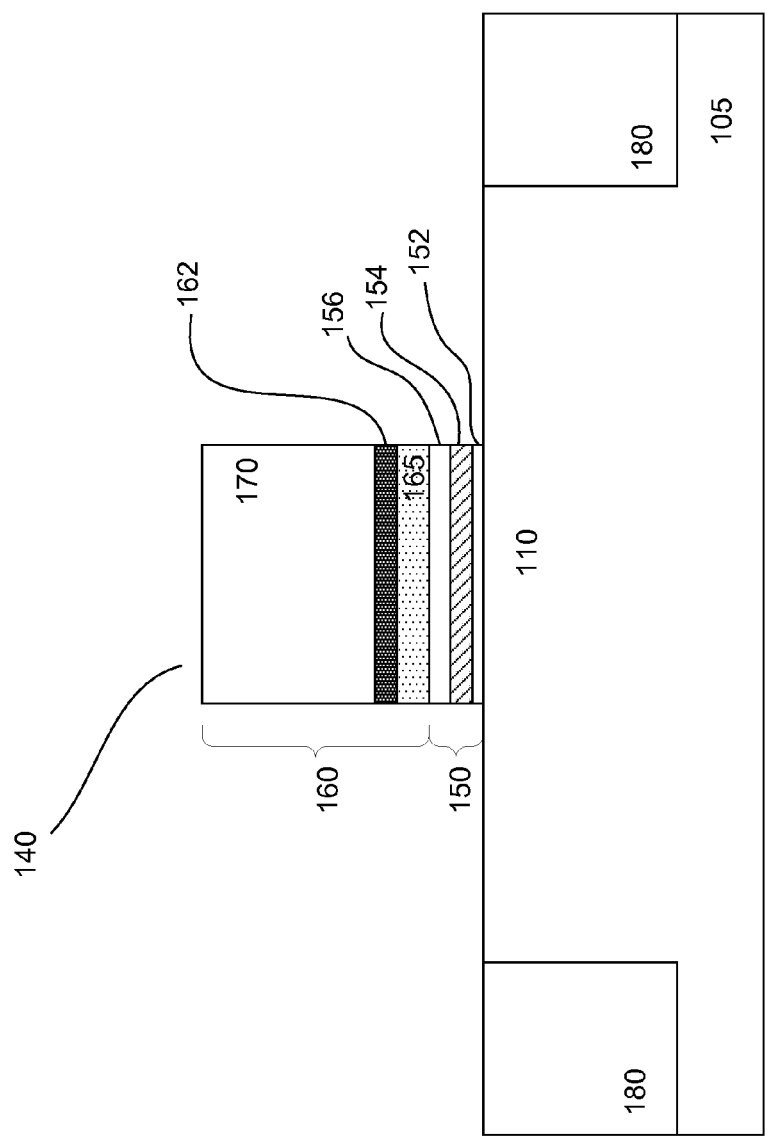

HIGH-K METAL GATE DEVICE

BACKGROUND

Figure 1A:
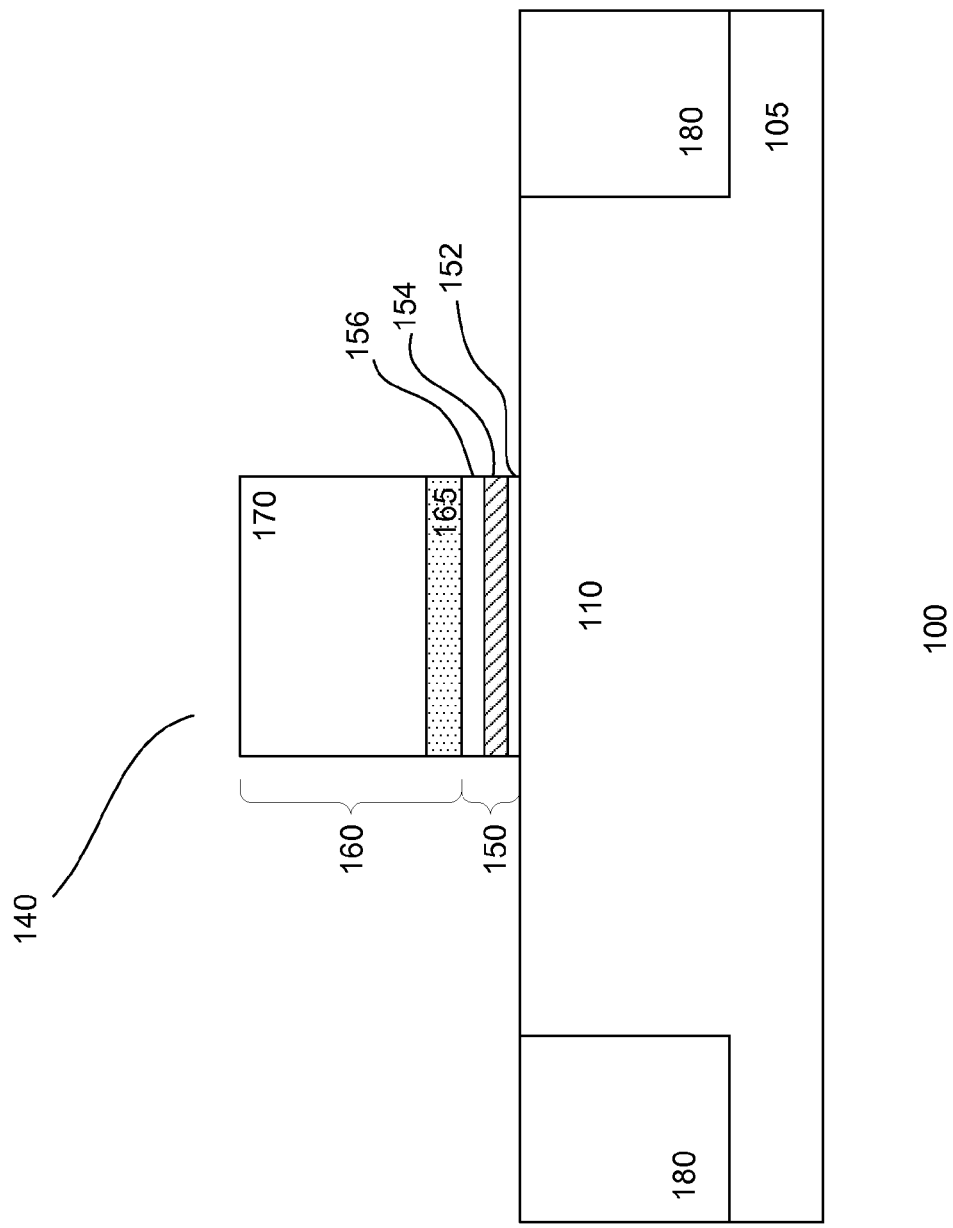

Semiconductor devices are continuously improved to enhance device performance. For example, a transistor device includes a gate stack on a semiconductor substrate. The gate stack includes a gate electrode over a gate dielectric layer. Smaller devices and shrinking ground rules are the keys to enhance performance and to reduce cost. As devices are being scaled down, the technology becomes more complex, and changes in device structures and new fabrication methods are needed to maintain the expected performance enhancement from one generation of devices to the next.

In standard CMOS devices, polycrystalline silicon (poly-Si) is the standard gate material used. The technology of fabricating CMOS devices using poly-Si gates has been in a constant state of development, and poly-Si gates are widely used in the semiconductor industry. However, there are problems associated with using a poly-Si gate. For example, due to the poly depletion effect and relatively high electrical sheet resistance, poly-Si gates commonly used in CMOS devices are becoming a stymieing factor in chip performance for devices of submicron generations. Another problem with poly-Si gates is that the dopants in the poly-Si gate, such as boron, can easily diffuse through the gate dielectric causing further degradation of the device performance.

There is a great difficulty in maintaining performance improvements in devices of submicron generations. Therefore, methods for improving performance without scaling down have become of interest. There is a promising avenue toward higher gate dielectric capacitance without having to make the gate dielectric actually thinner. This approach involves the use of high-K materials. The dielectric constant of such materials is significantly higher than that of silicon dioxide ($SiO_2$). A high-K material may be significantly thicker than $SiO_2$, and still have a lower equivalent oxide thickness (EOT) value. The EOT, as known in the art, refers to the thickness of such a $SiO_2$ layer which has the same capacitance per unit area as the dielectric layer in question. However, there are problems associated with using such high-K material. For example, any oxygen that diffuses to high-k material causes unwanted dielectric growth. This is undesirable, as the resulting thickness variations can result in the overall geometry and uniformity of the devices being significantly impaired. Moreover, the increased gate dielectric thickness degrades drain currents and also limits gate length scaling.

SUMMARY

A method of forming a semiconductor device is disclosed. The method includes providing a substrate. The method further includes forming a gate stack having a gate electrode on the substrate, which includes forming a metal gate electrode layer, forming a buffer gate electrode layer on top of the metal gate electrode layer and forming a top gate electrode layer having a poly-silicon alloy over the metal gate electrode layer.

In another embodiment, a method of forming a semiconductor device is described. The method includes providing a substrate. The method further includes forming a gate stack having a gate electrode on the substrate, which includes forming a metal gate electrode layer and forming a top gate electrode layer having a poly-silicon alloy over the metal gate electrode layer.

In yet another embodiment, a semiconductor device is disclosed. The semiconductor device includes a substrate and a gate stack having a gate electrode on top of the substrate. The gate electrode includes a metal gate electrode and a top gate electrode having a poly-silicon alloy over the metal gate electrode.

These and other objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

DRAWINGS

Figure 4:
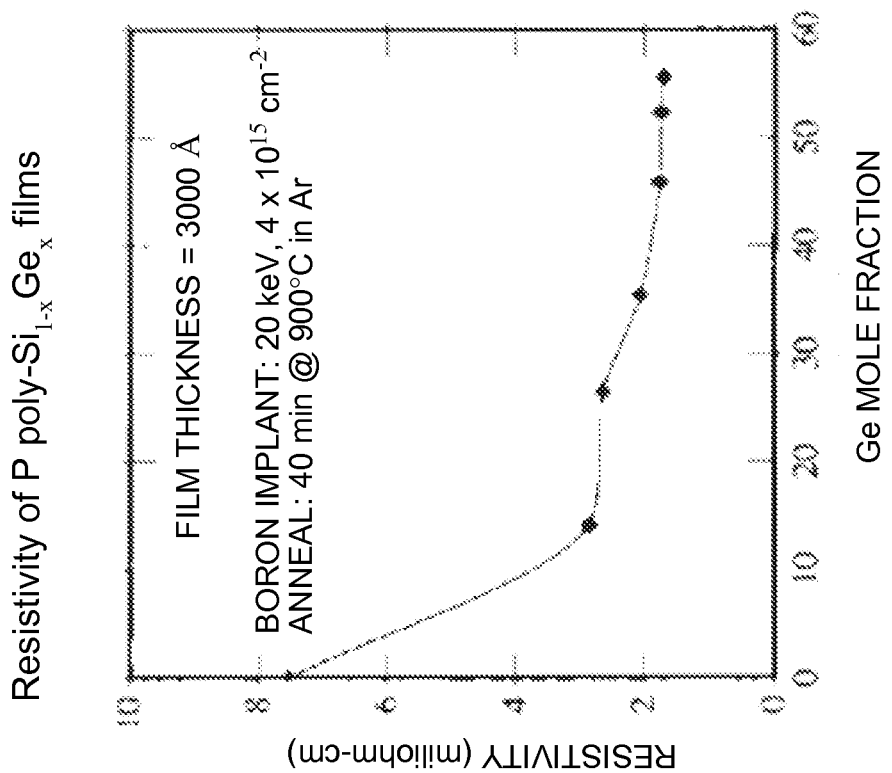
Figure 5:
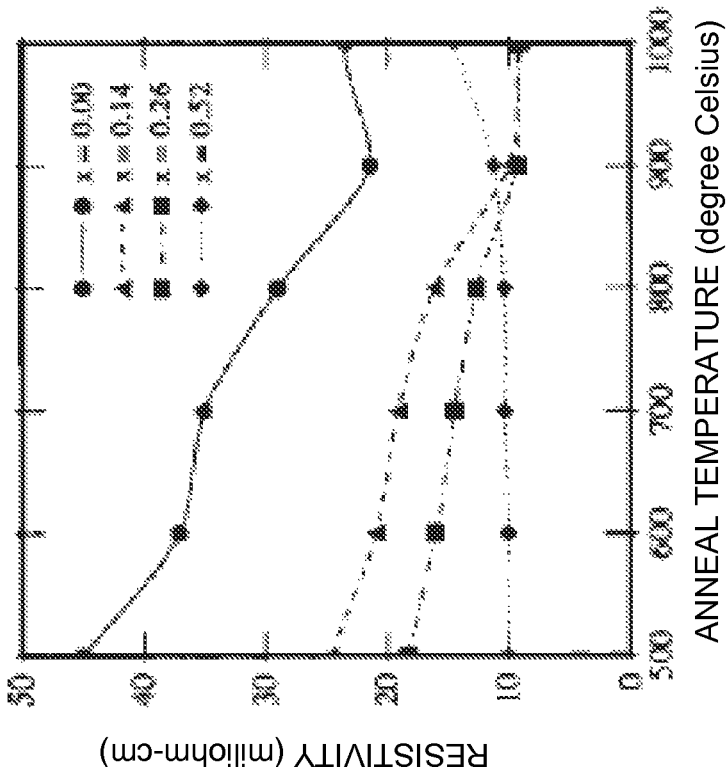

In the drawings, like reference characters generally refer to the same parts throughout the different views. Also, the drawings are not necessarily to scale, emphasis instead generally being placed upon illustrating the principles of the invention. Embodiments will now be described, by way of example with reference to the drawings of which:

FIGS. 1a-b are cross-sectional views of different embodiments of a device;

FIGS. 2a-e show a process of forming an embodiment of a device;

FIGS. 3a-d show a process of forming another embodiment of a device;

FIG. 4 shows experimental results measuring resistance of a SiGe film with respect to amount of Ge; and FIG. 5 shows experimental results measuring resistance of a SiGe film with respect to annealing temperature.

DETAILED DESCRIPTION

Embodiments generally relate to semiconductor devices. Some embodiments relate to devices having uniform gate oxide thickness. Such devices, for example, can be incorporated into standalone devices or ICs, such as microcontrollers or system on chips (SoCs). The devices or ICs can be incorporated into or used with, for example, electronic products, computers, cell phones, and personal digital assistants (PDAs). The devices may also be incorporated into other types of products.

FIGS. 1a-b show cross-sectional views of various embodiments of a portion of a device 100. Referring to FIG. 1a, a substrate 105 is shown. The substrate, for example, is a semiconductor substrate, such as a silicon substrate. In one embodiment, the substrate comprises a p-type doped substrate. For example, the p-type doped substrate is a lightly doped p-type substrate. Other types of semiconductor substrates, including group III-IV substrate or those which are undoped or doped with the same or different types of dopants, such as silicon on insulator (SOI), silicon germanium, or gallium, may also be used. Providing other types of substrate may also be useful.

The substrate includes a device region 110. The device region, for example, is surrounded by an isolation region 180. The isolation region separates the device region from other device regions on the substrate (not shown). The isolation region, for example, is a shallow trench isolation (STI) region. Other types of isolation regions may also be employed. The STI region, for example, extends to a depth of about 300 nm. Providing STI regions which extend to other depths may also be useful.

The device region, for example, is an active device region of a transistor. A doped well (not shown) may be provided in the device region for the transistor. The doped well, for example, may extend below the STI region. For example, the doped well extends to about 400-500 nm deep. The doped well may have a second polarity type dopant for a first polarity type transistor. For example, a p-type doped well is for a n-type transistor. The dopant concentration of the doped well, for example, may be about the range of 1E12-E13 $cm^{-2}$. Other parameters for the doped well may also be useful. P-type dopants may include boron (B), aluminum (Al), indium (In) or a combination thereof, while n-type dopants may include phosphorus (P), arsenic (As), antimony (Sb) or a combination thereof.

The substrate may include other device regions. The device regions may be for other types of devices, including both p-type and n-type devices. For example, the IC may include logic regions in which logic devices are formed. Depending on the type of IC formed, the logic regions, for example, may include regions for different voltage devices. For example, the logic regions may include regions for high voltage (HV) devices, medium or intermediate voltage (IV) devices and low voltage (LV) devices. Other configurations of logic regions may also be useful. Additionally, other types of device regions may also be provided, for example, array regions for memory cells.

A gate stack 140 of a transistor is disposed in the device region. The gate stack includes a gate electrode 160 over a gate dielectric 150. As shown, the gate dielectric is a composite gate dielectric having multiple dielectric layers. Similarly, the gate electrode is a composite gate electrode having multiple gate electrode layers. In one embodiment, the composite gate dielectric and composite gate electrode form a high-K metal gate.

In one embodiment, composite gate dielectric comprises first, second and third dielectric layers 152, 154 and 156. Providing a composite gate dielectric having other number of layers may also be useful. As shown, the first layer is disposed on the substrate, the second layer is over the first layer and the third layer is over the second layer. At least one of the dielectric layers is a high-K dielectric layer.

The first dielectric layer is an interfacial oxide. The interfacial oxide, for example, may be $SiO_2$ or SiON. The thickness of the interfacial oxide layer may be about 8-15 Å. The interfacial oxide layer may also have other thicknesses. As for the second dielectric layer, it is a high-K dielectric layer. The high-K dielectric layer, for example, may be Hf-based high-K such as $HfO_2$, HfON, Hf—Si—$O_2$ or Hf—SiON, Al-based high-K or Zr-based high-K. The second dielectric layer, for example, may include more than one high-K dielectric layer. Other combinations of high-K dielectric layers may also be used to increase the dielectric constant value at the thickness range of 10-50 Å. Providing other types of high-K dielectric materials may also be useful. The thickness of the high-K dielectric layer may be about 10-50 Å. The high-K dielectric layer may also have other thicknesses. The third dielectric layer serves as a capping layer of the composite gate dielectric. The capping layer, for example, can be another high-K layer (i.e. $Al_2$—$O_3$, $La_2O_3$ or etc.), $SiO_2$ or SiON. Other types of capping material may also be used. The purpose of the capping layer is mainly determined by the desired poly electrode work function. For instance, Al-based and La-based has been used in PFET and NFET, respectively, for their respective work-function. The thickness of the capping layer may be about 5-20 Å. The capping layer may also have other thicknesses.

The composite gate electrode, in one embodiment, includes a metal gate electrode layer 165 below a top gate electrode layer 170. The metal gate electrode is disposed over the composite gate dielectric. For example, the metal gate electrode is disposed on the capping layer of the composite gate dielectric. The metal gate electrode, in one embodiment, is disposed directly on top of the capping layer. In one embodiment, the metal gate layer comprises TiN, TaN, TiAlN, TaN/TiN, TaC or TaCN. Other types of metal gate materials may also be useful. The thickness of the metal gate layer, for example, is about 50-200 Å. Providing a metal gate layer of other thicknesses may also be useful.

The top gate electrode layer is disposed over the metal gate electrode. In one embodiment, the top gate electrode layer is disposed directly on top of the metal gate electrode. The top gate electrode layer, in one embodiment, includes a non-metal gate electrode. The top gate electrode layer has a polycrystalline (poly) structure. The top gate electrode layer, in one embodiment, comprises a poly-silicon alloy. The poly-silicon alloy reduces resistance at the metal gate and top gate electrodes. For example, the poly-silicon alloy reduces resistance at the interface of the metal gate and top gate electrodes. The thickness of the top gate electrode layer, for example, is about 100-800 Å. Providing a top gate electrode layer of other thicknesses may also be useful.

In one embodiment, the top gate electrode comprises polysilicon germanium (SiGe). The SiGe top gate electrode reduces resistance between the metal gate and top gate electrodes. For example, the SiGe top gate electrode reduces resistance at the interface of the top gate and the metal gate electrodes. The lower interfacial resistance provides better gate control and therefore better Ion-Ioff and short-channel effect can be achieved. The use of a poly-silicon alloy also reduces the thermal budget required in forming the device as compared to polysilicon.

In the case where the top gate electrode comprises polysilicon, it has been found that the resistance between the top gate and metal gate electrodes is high. This may be due to protrusion of oxygen caused by the incorporation of oxygen-related processes. However, we have discovered that the use of a poly-silicon alloy, such as SiGe, reduces resistance between the top gate and metal gate electrodes.

Furthermore, we have discovered that resistance between the top gate and metal gate electrodes can be further reduced by doping the top gate electrode with dopants. In one embodiment, the top gate electrode is doped with p-type dopants such as B dopants. Other types of dopants may also be useful to further decrease the resistance between the top and metal gate electrodes. It has been further discovered that the contents of Ge in the SiGe alloy is inversely related with the resistance between the top gate and metal gate electrodes. For example, the higher the Ge content, the lower the resistance. The Ge content of the SiGe alloy, for example, is about 1-60 mole fraction. Preferably, the Ge content of the SiGe alloy, is about 10-50 mole fraction. Providing other Ge contents in the SiGe alloy may also be useful. Not to be bound by theory, it is believed that the content of the alloying element of poly-silicon increases the dopant activation as a result of increased solid solubility.

The device may include additional elements which are not shown. For example, the device may include heavily doped source/drain regions adjacent to the gate. The source/drain regions are doped with first polarity type dopants for a first type transistor. Dielectric gate sidewall spacers may be provided on the sidewalls of the gate. The gate sidewall spacers may be used to facilitate forming or defining lightly doped source/drain extension regions of the first polarity type. Metal silicide contacts may be disposed on the source/drain regions and top of the gate stack. Additionally, one or more interlevel dielectric layers in which interconnects are formed may also be provided.

FIG. 1b shows a cross-sectional view of another embodiment of a portion of a device. The device shown is similar to that described in FIG. 1a. Common elements will not be described. In one embodiment, the composite gate electrode 160 includes a buffer gate electrode layer 162 above the metal gate electrode layer 165. The buffer gate electrode layer improves adhesion between the top gate electrode layer and the metal gate electrode layer. In one embodiment, the buffer electrode layer is an amorphous silicon layer. The buffer electrode layer may be crystallized after anneal in subsequent processing. The thickness of the buffer layer, for example, is about 20-100 Å. Providing a buffer layer with other thicknesses may also be useful.

Figure 2B:
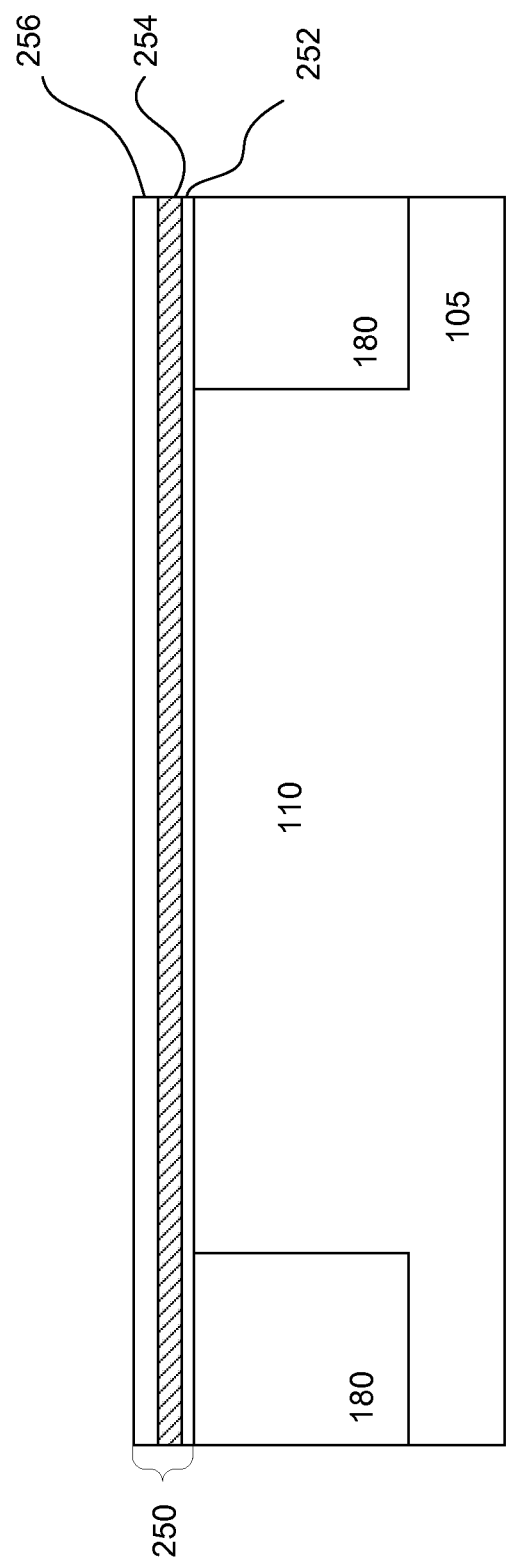

FIGS. 2a-e show cross-sectional views of an embodiment of a process 200 for forming a device or IC. Referring to FIG. 2a, a substrate 105 is provided. The substrate can comprise a silicon substrate, such as a lightly doped p-type substrate. Other types of substrates, including silicon germanium or silicon-on-insulator (SOI), are also useful.

As shown in FIG. 2a, a device region 110 is defined on the substrate. Although one device region is shown, it is however understood that the substrate may include various types of regions (not shown). For example, the substrate may include other device regions for other types of devices. The IC may include logic regions in which logic devices are formed. Depending on the type of IC formed, the logic regions, for example, may include regions for different voltage devices. For example, the logic regions may include regions for high voltage (HV) devices, medium or intermediate voltage (IV) devices and low voltage (LV) devices. Other configurations of logic regions may also be useful. Additionally, other types of device regions may also be provided.

The device region is separated from other regions by an isolation region 180. The isolation region surrounds the device region. The isolation region comprises, for example, an STI region. Various processes can be employed to form the STI region. For example, the substrate can be etched using etch and mask techniques to form trenches which are then filled with dielectric materials such as silicon oxide. Chemical mechanical polishing (CMP) can be performed to remove excess oxide and provide a planar top surface. Other processes or materials can also be used to form the STI. Other types of isolation regions may also be employed. The depth of the STI may be, for example, about 300 nm. The STI may also have other depths.

A device well (not shown) may be formed in the device region. The device well, in one embodiment, comprises dopants which form a doped well. The depth of the doped well, for example, may be about 400-500 nm. Providing a doped well having other depths may also be useful. The doped well may be formed by implanting appropriate dopants with the desired dose and power into the substrate. The dopant type, dose and power may depend on the type of device to be formed. The doped well may comprise second polarity type dopants for a first polarity type device. For example, a p-type doped well may be for a n-type transistor. On the other hand, a n-type doped well may be for a p-type transistor.

To form the doped well, a well implant mask which exposes the device region is used. The implant mask, for example, comprises photoresist patterned by a lithographic mask. Since the device isolation region can serve as an implant mask, this allows for increased processing window for the patterning process to form the implant mask. The implant mask may be removed after the deep well is formed. Other techniques for forming the deep device well may also be useful. An anneal may be performed to diffuse the dopants, forming a doped well which extends to under the bottom of the STI.

Referring to FIG. 2b, a composite gate dielectric stack 250 is formed on the substrate. In one embodiment, first, second and third dielectric layers 252, 254 and 256 of the composite gate dielectric stack are formed on the substrate. In one embodiment, the first dielectric comprises an interfacial oxide layer. The interfacial oxide layer is formed on the substrate. The interfacial oxide layer comprises $SiO_2$ or SiON. In one embodiment, the interfacial oxide layer is formed by thermal oxidation process. For example, the interfacial oxide layer is formed by thermal oxidation with N incorporation at temperature range of 850-1100° C. and $O_2$ gas ambient. The first dielectric layer is about 8-15 Å thick. Forming the first dielectric layer with other thicknesses may also be useful.

The second dielectric layer is formed over the first dielectric layer. In one embodiment, the second dielectric layer is a high-K dielectric layer. Various types of high-K dielectric materials may be used. For example, the second dielectric layer may be Hf-based high-K such as $HfO_2$, HfON, Hf—Si—$O_2$ or Hf—SiON, Al-based high-K or Zr-based high-K. Other types of high-K materials may also be used to form the second dielectric layer. The second dielectric layer is about 10-50 Å thick. Forming the second dielectric layer with other thicknesses may also be useful. The second dielectric layer may be formed by, for example, CVD. The second dielectric layer may also be formed using other deposition processes.

The third dielectric layer is formed over the second dielectric layer. In one embodiment, the third dielectric layer is a capping layer. Various types of dielectric materials may be used to form the capping layer. For example, the capping layer may be, another high-K material (i.e. $Al_2$—$O_3$, $La_2O_3$ or etc), $SiO_2$ or SiON. Other types of capping materials may also be used to form the third dielectric layer. The third dielectric layer is about 5-20 Å thick. Forming the third dielectric layer with other thicknesses may also be useful. The third dielectric layer may be formed by, for example, CVD. The third dielectric layer may also be formed using other deposition processes.

In FIG. 2c, a metal gate layer 265 of the composite gate electrode is formed. The metal gate layer is formed, for example, over the capping layer. In one embodiment, the metal gate layer comprises TiN, TaN, TiAlN, TaN/TiN, TaC or TaCN. Other types of metal gate materials may also be used. The metal gate layer is about 50-200 Å thick. Forming the metal gate layer with other thicknesses may also be useful. The metal gate layer may be formed by, for example, CVD or sputtering process. The metal gate layer may also be formed using other deposition processes.

Figure 2D:
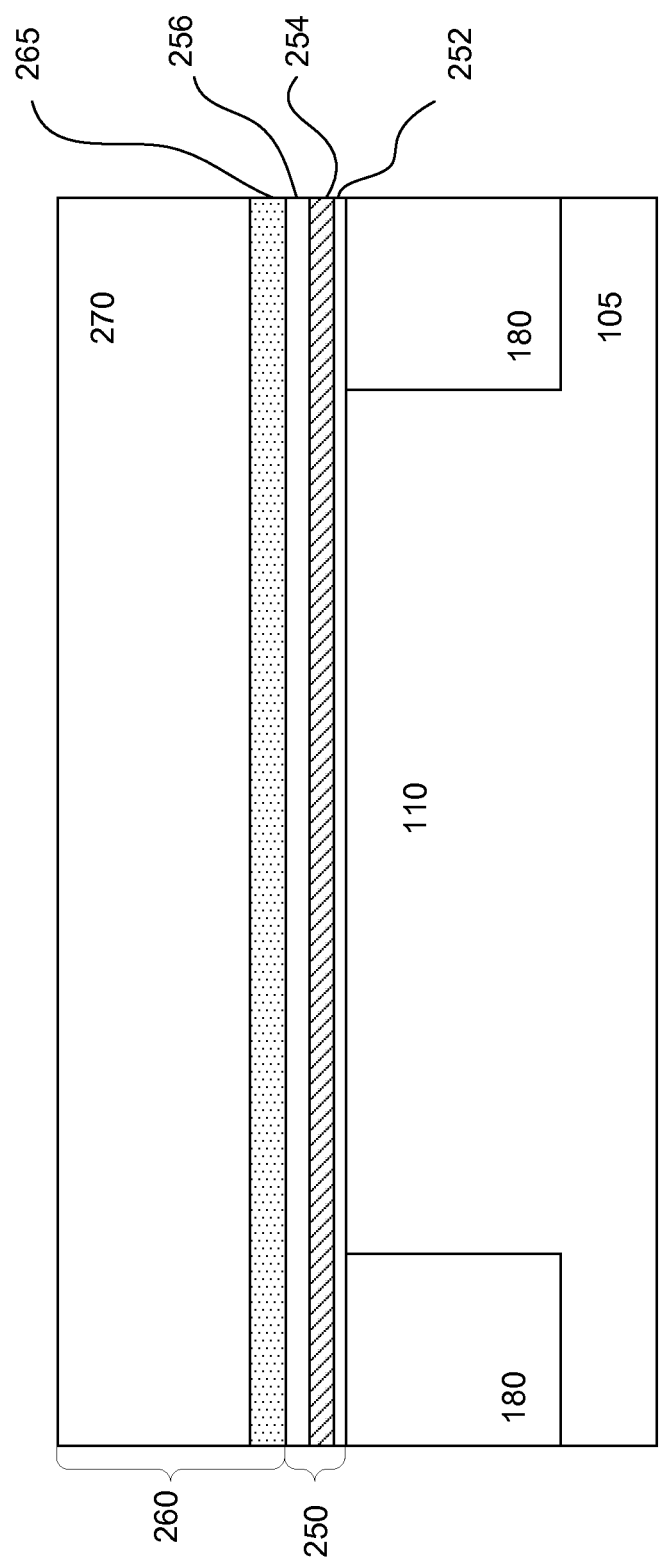

As shown in FIG. 2d, a top gate electrode layer 270 of the composite gate electrode is formed on the substrate. The top gate layer is, for example, over the metal gate layer, forming a composite gate electrode 260 stack. In one embodiment, the top gate layer comprises poly-silicon alloy. The poly-silicon alloy, for example, comprises poly-silicon germanium (SiGe). Other types of top gate electrode materials may also be used. The top gate electrode layer is about 100-800 Å thick. Forming the top gate electrode layer with other thicknesses may also be useful. The top gate electrode layer may be formed by, for example, CVD. The top gate layer may also be formed using other deposition processes.

Referring to FIG. 2e, the various gate layers are patterned to form a gate stack 140 with a composite gate electrode 160 over a composite gate dielectric. Patterning the gate layers may be achieved by mask and etch techniques. For example, a photoresist layer is formed over the top gate layer and patterned, exposing portions of the top gate layer. An anisotropic etch, such as a RIE, is performed to remove exposed portions of the top gate layer and gate layers below. To improve lithographic resolution, an anti-reflective coating (ARC) can be provided beneath the photoresist. Other techniques for patterning the gate layers may also be useful.

The process continues to form the device. For example, further processing can include forming sidewall spacers on gate sidewalls, source/drain regions adjacent to the gate and metal silicide contacts may be formed on the various contact regions and the surface of the gate electrode. The processing may further include forming a PMD layer and contacts to the terminals of the cell as well as one or more interconnect levels, final passivation, dicing, assembly and packaging. Other processes may also be included. For example, other components, such as low voltage, medium voltage, and high voltage I/O devices can be formed prior to forming the interconnections.

Figure 3C:
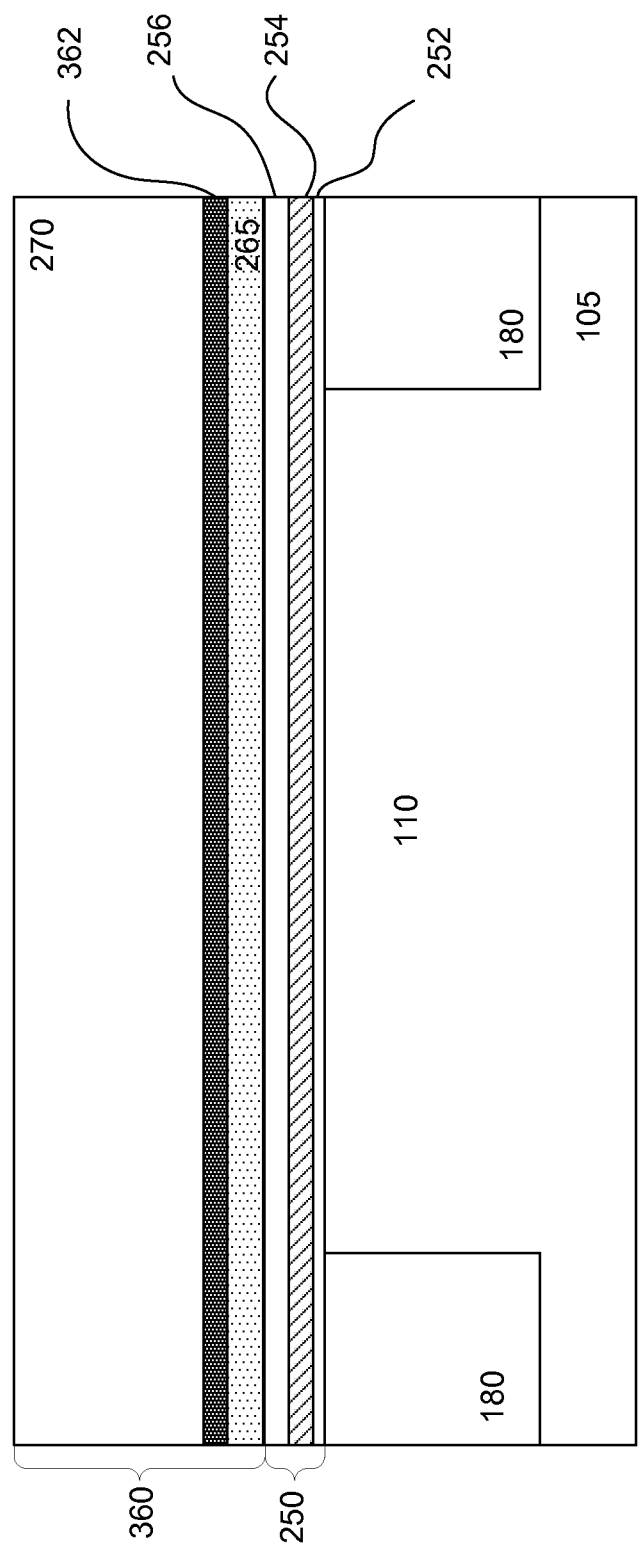

FIGS. 3a-d show cross-sectional views of another embodiment of a process 300 for forming a device or IC. Referring to FIG. 3a, a substrate 105 is provided. The substrate is at the stage of processing as described in FIG. 2b. For example, the substrate is prepared with an STI region 180 surrounding a device region 110, a doped well in the device region 110. Furthermore, dielectric layers 252, 254 and 256 of a composite gate dielectric stack 250 are formed on the substrate.

Referring to FIG. 3b, a metal gate layer 265 and a buffer gate layer 362 of a composite gate electrode are formed. The metal gate layer may be formed, as described in FIG. 2c. The buffer gate layer is formed, for example, over the metal gate layer. In one embodiment, the buffer gate layer comprises amorphous silicon. Other types of buffer gate materials may also be used. The buffer layer may be crystallized after anneal in subsequent processing. The buffer gate layer is, for example, about 20-100 Å thick. Forming the buffer gate layer with other thicknesses may also be useful. The buffer gate layer may be formed by, for example, CVD. The buffer gate layer may also be formed using other deposition processes.

In FIG. 3c, a top gate layer 270 is formed over the buffer gate layer. The top gate layer may be formed, as described in FIG. 2d.

Referring to FIG. 3d, the various gate layers are patterned to form a gate stack 140 with a composite gate electrode 160 over a composite gate dielectric. Patterning the gate layers may be achieved by mask and etch techniques. For example, a photoresist layer is formed over the top gate layer and patterned, exposing portions of the top gate layer. An anisotropic etch, such as a RIE, is performed to remove exposed portions of the top gate layer and gate layers below. To improve lithographic resolution, an anti-reflective coating (ARC) can be provided beneath the photoresist. Other techniques for patterning the gate layers may also be useful.

The process continues to form the device. For example, further processing can include forming sidewall spacers on gate sidewalls, source/drain regions adjacent to the gate and metal silicide contacts may be formed on the various contact regions and the surface of the gate electrode. The processing may further include forming a PMD layer and contacts to the terminals of the cell as well as one or more interconnect levels, final passivation, dicing, assembly and packaging. Other processes may also be included. For example, other components, such as low voltage, medium voltage, and high voltage I/O devices can be formed prior to forming the interconnections.

FIG. 4 shows experimental results measuring resistance of a SiGe film with respect to amount of Ge. The experiment measures resistance of SiGe films at 3000 Å having different Ge mole fractions. The SiGe film is implanted with B dopants. The dose of B dopants is $4\times10^{15}$ cm$^{-2}$ implanted at 20 KeV. The resistance of the different films are measured after an anneal at 900° C. in Ar for 40 minutes. The experimental results indicate that with increasing Ge content, the resistance of the film reduces, for example, from about 7.5 mΩ-cm at 0 Ge content to about 1.8 mΩ-cm with a Ge content of about 56 mole fraction. This indicates that increasing the content of Ge decreases resistance of the top gate electrode.

FIG. 5 shows experimental results measuring resistance of a SiGe film with respect to annealing temperature. The experiment measures resistance of SiGe films at 3000 Å implanted with B dopants at a dose of $1\times10^{15}$ cm$^{-2}$ at 20 keV. The resistances of the different films are measured after annealing the film at different annealing temperatures for 30 seconds. The experimental results indicate that resistivity reduces with higher Ge concentration.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method of forming a semiconductor device comprising:
    providing a substrate; and
    forming a gate stack having a gate electrode over a composite gate dielectric layer having more than two different dielectric layers on the substrate, comprising
        forming a metal gate electrode layer over the composite gate dielectric layer, and
        forming a top gate electrode layer directly over and contacts the metal gate electrode layer, wherein the top gate electrode layer comprises poly-silicon alloy, the top gate electrode layer being the uppermost gate electrode layer of the gate stack and the top gate electrode layer reduces resistance between the metal gate electrode layer and the top gate electrode layer.

2. The method of claim 1 wherein:
the poly-silicon alloy includes poly-silicon germanium (SiGe) and has a thickness of about 100-800 Å.

3. The method of claim 2 wherein the SiGe layer includes Ge content of about 1-60 mole fraction.

4. The method of claim 1 wherein the metal gate electrode layer includes TiN, TaN, TiAlN, TaN/TiN, TaC or TaCN.

5. The method of claim 1 wherein the composite gate dielectric layer comprises first, second and third dielectric layers.

6. The method of claim 5 wherein the second dielectric layer includes a high-K dielectric material which is provided on top of the first dielectric layer.

7. A method of forming a semiconductor device comprising:
    providing a substrate; and
    forming a gate stack having a gate electrode over a composite gate dielectric layer having more than two different dielectric layers on the substrate, comprising
        forming a metal gate electrode layer over the composite gate dielectric layer, and forming a top gate electrode layer directly over and contacts the metal gate electrode layer, the top gate electrode layer being the uppermost layer, the top gate electrode layer reduces resistance between the metal gate electrode layer and the top gate electrode layer of the gate stack.

8. The method of claim 7 wherein the top gate electrode layer comprises a poly-silicon alloy which includes poly-silicon germanium (SiGe).

9. The method of claim 8 wherein the SiGe layer includes Ge content of about 1-60 mole fraction.

10. The method of claim 7 wherein the metal gate electrode layer includes TiN, TaN, TiAlN, TaN/TiN, TaC or TaCN and has a thickness of about 50-200 Å.

11. The method of claim 7 wherein the composite gate dielectric layer comprises first, second and third dielectric layers.

12. The method of claim 11 wherein the second dielectric layer includes a high-K dielectric material which is provided on top of the first dielectric layer.

13. The method of claim 12 wherein the high-K dielectric material includes Hf-based high-K, Al-based high-K, Zr-based high-K or a combination thereof.

14. The method of claim 7 wherein the top gate electrode layer comprises a poly-silicon alloy which is doped with p-type dopants.

15. The method of claim 14 wherein the poly-silicon alloy comprises poly-silicon germanium.

16. The method of claim 15 wherein the p-type dopants comprise boron.

* * * * *